United States Patent
Crofts et al.

(10) Patent No.: US 6,342,817 B1
(45) Date of Patent: Jan. 29, 2002

(54) PRECISION OSCILLATOR CIRCUITS AND METHODS WITH SWITCHED CAPACITOR FREQUENCY CONTROL AND FREQUENCY-SETTING RESISTOR

(75) Inventors: Andrew H. Crofts, Chipita Park; Michael A. Kultgen, Colorado Springs, both of CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/684,317

(22) Filed: Oct. 6, 2000

(51) Int. Cl.[7] .................................................. H03L 7/00

(52) U.S. Cl. ............................ 331/1 R; 331/16; 331/17

(58) Field of Search ................................... 331/1 A, 1 R, 331/8, 16, 17

(56) References Cited

U.S. PATENT DOCUMENTS

| | | | |
|---|---|---|---|
| 5,053,723 A | * 10/1991 | Schemmel | 331/14 |
| 5,594,388 A | 1/1997 | O'Shaughnessy et al. | 331/1 R |
| 5,994,967 A | 11/1999 | Nguyen | 331/1 R |

OTHER PUBLICATIONS

T.R. Viswanathan, S. Murtuza, V.H. Syed, J. Berry, and M. Staszel, "Switched–Capacitor Frequency Control Loop", *IEEE J. Solid–State Circuits*, vol. SC–17, No. 4, Aug. 1982, pp. 775–778.

A.A. Abidi, "Linearization of Voltage–Controlled Oscillators Using Switched–Capacitor Feedback", *IEEE J. Solid–State Circuits*, vol. SC–22, No. 3, Jun. 1987, pp. 494–496.

M.H. Wakayama and A.A. Abidi, "A 30–MHz Low–Jitter High–Linearity CMOS Voltage–Controlled Oscillator", *IEEE J. Solid–State Circuits*, vol. SC–22, No. 6, Dec. 1987, pp. 1074–1081.

* cited by examiner

*Primary Examiner*—David Mis
(74) *Attorney, Agent, or Firm*—Fich & Neave; Joel Weiss

(57) ABSTRACT

A precision oscillator circuit providing a periodic waveform is provided. A periodic waveform is provided by the use of an integrating op-amp circuit in conjunction with a switched capacitor frequency control loop and a user input adapted to be coupled with a frequency-setting resistor. The frequency of the periodic waveform is determined by the values of the switched capacitor and the resistor. The oscillator circuit has an arrangement which minimizes the effect of the op-amp circuit's offset voltage. The user input is kept robust against user-introduced capacitance by the use of controllable current sources to bias the op-amp circuit. A linearity correction circuit is also provided to correct for non-ideal op-amp circuits.

18 Claims, 4 Drawing Sheets

PRECISION OSCILLATOR CIRCUITS AND METHODS WITH SWITCHED CAPACITOR FREQUENCY CONTROL AND FREQUENCY-SETTING RESISTOR

BACKGROUND OF THE INVENTION

In the design of electronic circuits, periodic waveform signals are often required for purposes including clocked computer and control circuits, communication circuits requiring pulses, and test and measurement circuits. The present invention relates to circuits which supply periodic waveform signals. More specifically, the present invention relates to using a switched-capacitor feedback loop to bias a variable oscillator so that it produces an accurate and stable periodic waveform.

There are a few popular options available for generating a periodic waveform. Low-cost RC (resistor-capacitor) oscillators can be built using discrete components such as comparators, resistors, and capacitors, or using simple integrated circuits such as the industry standard 555 timer in conjunction with several discrete components. These solutions are bulky and inaccurate, especially at frequencies greater than a few hundred kilohertz.

On the other hand, accurate oscillators may be built using ceramic resonators or crystals as a stable frequency element. However, these circuits are also bulky and tend to be more expensive than RC oscillators. It is difficult or impossible to vary their frequency, as they are usually available only in preset frequencies. A phase-locked loop circuit may be used to generate a range of frequencies at increased cost. There is a need for a circuit that combines the frequency stability of a ceramic resonator with the low-cost, flexibility, and ease-of-use of an RC oscillator, while requiring less space than either.

A simple RC oscillator circuit will suffer from poor initial accuracy and stability over supply and temperature. In addition, these circuits usually have poor linearity when operated over a large—e.g., 10:1—frequency range.

There are two ways to improve the accuracy. Open-loop techniques involve using very fast comparators, accurate voltage references, and linearity correction circuits that attempt to predict and correct for the inherent non-linearity of the basic circuit. The performance of such a circuit is fundamentally limited by the number of circuit elements, each contributing a certain amount of error to the oscillation frequency.

Closed-loop, or feedback, techniques place the basic oscillator circuit inside a high-gain feedback loop that suppresses the oscillator's inaccuracies. The accuracy is substantially determined by the feedback path, which may consist of much fewer devices. Feedback techniques, often using op-amps are popular because they change the critical components from one part of the circuit to another of the designer's choosing. In the case of an RC oscillator, the accuracy of the basic oscillator circuit can be neglected. Proper design of the feedback and input circuits will results in an overall design that can be much more accurate, stable, and linear than possible using open-loop techniques.

The feedback circuit must convert frequency into another type of signal for comparison against an accurate reference. A switched-capacitor is an excellent candidate for use in a feedback circuit because it can act as a "frequency-controlled resistor" with value $R=1/(f*C)$. Placing a controlled voltage ($V_{REF}$) across the switched-capacitor allows it to generate an average current that is proportional to frequency ($I_{FREQ}$). This current may be subtracted from a reference current ($I_{REF}$) to generate an error current. This error current is used to adjust the oscillator frequency by changing its input (either voltage or current). If the feedback loop can force the error current to zero, then the frequency will be equal to $I_{REF}/(C*V_{REF})$.

One way to process the error current is to integrate it across a second capacitor, creating a voltage that may be used as input to the oscillator. In switched-capacitor circuits, it is common to implement an integrator with an op-amp that places the second capacitor in a negative feedback loop between the op-amp output and its negative input. Because an op-amp forces the voltage between its inputs to near zero, this circuit allows the switched-capacitor voltage to be set by applying the proper voltage at the op-amp's positive input.

The switched-capacitor current will not be continuous, but will instead transfer packets of charge each clock cycle. While its average current is $I_{FREQ}=f*C*V_{REF}$, the charge transfer occurs at discrete points in time unlike a true resistor. Therefore, the voltage at the output of the op-amp will be a sawtooth waveform, with near-instantaneous jumps in voltage once each clock cycle, and a continuous ramp due to $I_{REF}$ in between.

A switched capacitor feedback loop used in conjunction with an integrating amplifier circuit is described in T. R. Viswanathan et al., "Switched-Capacitor Frequency Control Loop," IEEE J. of Solid-State Circuits, 17(4):774–778 (August 1982) ("Viswanathan").

FIG. 1 shows the architecture of the switched capacitor frequency control loop described by Viswanathan. An oscillator circuit 100 includes a voltage reference 130, which is used to supply a current through a resistor 112 (R) to an inverting input of an amplifier circuit 120. Amplifier circuit 120 includes an inverting feedback loop with a capacitor 116 acting as an integrator.

A two-phase clock generator 124 provides clock signal 126 and clock signal 128 which exhibit a 180° phase difference from each other. When clock signal 126 is high, switches 104 and 106 are closed; when clock signal 126 is low, switches 104 and 106 are open. When clock signal 128 is high, switches 102 and 110 are closed; when clock signal 128 is low, switches 102 and 110 are open. The overall effect of switches 126 and 128 is to alternately couple and de-couple a switched capacitor 108 (C) from amplifier circuit 120 and voltage reference 130.

The coupling and de-coupling of switched capacitor 108 removes a charge packet from the inverting input of amplifier circuit 120 every clock cycle. The combination of the current flowing through resistor 112 and the periodic switching of switched capacitor 108 provides a signal at the output of amplifier circuit 120 resembling a sawtooth waveform. At a certain frequency given by $f=1/(R*C)$, the amount of charge removed in a single cycle by the switched capacitor is equal to the accumulated charge added by the resistor in the same amount of time. If the switched-capacitor is operated at that frequency, the average value of the sawtooth waveform at the op-amp output will not change over time. At higher frequencies, the average switched-capacitor current is greater and the average value of the op-amp output rises. Likewise, at lower frequencies, the average value of the op-amp output voltage falls.

FIG. 1 also shows a loop filter 122 which is coupled between amplifier circuit 120 and a suitable VCO (Voltage Controlled Oscillator) 118. Loop filter 122 averages the output of the integrating amplifier for use as input to VCO 118. By averaging the output, the loop filer 122 determines the frequency of the periodic waveform VCO 118 produces.

Two-phase clock generator 124 generates the switched-capacitor clocks 126 and 128 based on the VCO output. This completes the feedback loop, as the switched-capacitor current is determined by the VCO frequency.

Viswanathan further acknowledges that resistor 112 may be replaced by any suitable current source, creating a current-to-frequency converter. Similarly, applying two different voltage references to the resistor and switched capacitor causes an analog-to-digital conversion of voltages based on time or frequency measurement.

An alternative architecture with a switched capacitor loop is described by Asad A. Abidi, "Linearization of Voltage-Controlled Oscillators Using Switched-Capacitor Feedback," IEEE J. of Solid-State Circuits, 22(3):494–496 (June 1987) ("Abidi") which is shown in FIG. 2.

An oscillator circuit 200 shown in FIG. 2 includes an amplifier circuit 208 configured in an inverting integrating amplifier configuration with a capacitor 206. A voltage reference 202 ($V_2$) is coupled to an inverting input of amplifier circuit 208 through a resistor 204 (R).

FIG. 2 also shows a switched capacitor frequency control loop with a VCO 220 controlling a switched capacitor 216 (C) by opening and closing switches 210 and 212. Switches 210 and 212 are controlled by oscillating signals 222 and 224 from VCO 220, in a similar fashion to Viswanathan's circuit, to periodically couple switched capacitor 216 to the inverting input of amplifier circuit 208. The amount of charge transferred by switched capacitor 216 is proportional to the change in differential voltage across switched capacitor 216. This change is the difference between voltage reference 214 ($V_1$) and the voltage at the inverting input of amplifier circuit 208.

Abidi's implementation places different voltages across switched capacitor 216 and resistor 204, a variation that was included in Viswanathan's paper. This voltage difference leads to the inclusion of voltage references 202 ($V_2$) and 214 ($V_1$), in the steady-state frequency f for oscillator circuit 200, where $f=V_2/(C*R*V_1)$. The additional terms contributing to the steady-state frequency add more complexity to the building of an oscillator circuit with an accurate frequency.

Error is introduced to Abidi's oscillator circuit by the offset error voltage of the op-amp. Furthermore, during the ramping portion of the op-amp's sawtooth output, a small voltage must be developed across the op-amp inputs, creating another "effective" offset voltage. The magnitude of this voltage is dependent on the gain-bandwidth product of the op-amp and the ramp slew rate, which increases with smaller values of frequency-setting resistor. This voltage difference also creates error in the output frequency.

Further error is introduced into Viswanathan's and Abidi's oscillator circuits by the discrete changes in the circuits' output voltages. When the switched capacitor is coupled to the op-amp's inverting input, it will cause a nearly instantaneous change in the op-amp's output that is equal to the change in capacitor voltage times the ratio of the switched-capacitor to the integrating capacitor. If the change in the switched capacitor's voltage is ΔVin, then the change in the op-amp's output voltage will be ΔVout=ΔVin*(Csw/Cint). During this change in output, the negative input deviates from its steady-state value by nearly ΔVin, then recover at a rate determined by the op-amp's gain-bandwidth product. During this recovery time, the current flowing through the resistor is in error. The cumulative effect of this process is an error in the charge transferred through the resistor during each clock cycle.

Another source of error to the oscillator circuit is the user's inadvertent introduction of capacitance to the oscillator circuit in the overall integration of the user's electronic circuit. Viswanathan's and Abidi's oscillator circuits do not address the issue of capacitance introduced by the user to the oscillator circuit. While stray capacitance in an op-amp circuit can sometimes cause the circuit to be unstable, a different problem may occur in these oscillator circuits. If the parasitic capacitance on the op-amp input is of a similar size to the integrating capacitor, it will reduce the bandwidth of the op-amp circuit. This may prevent the circuit from settling quickly enough after the switched-capacitor is attached to the inverting input, creating an error. Since Abidi's and Viswanathan's circuits are not integrated, it is unlikely that this would be a problem because a large integrating capacitor could be used. However, in a monolithic integrated circuit, the maximum capacitance is quite limited. A user of such an integrated circuit could accumulate excess capacitance from the printed circuit board.

Furthermore, Viswanathan's and Abidi's oscillator circuits are not very practical. First, because they are not integrated circuits, they require a large amount of physical space for the various components. Second, achieving high accuracy requires costly accurate components. In particular, very accurate capacitors are expensive components, while accurate resistors are much more affordable.

It would be desirable to provide a variable frequency oscillator circuit utilizing a switched-capacitor feedback loop to minimize the inaccuracy of a typical oscillator.

It would also be desirable to provide an input to the oscillator circuit whereby the user may couple a resistor to the oscillator circuit. The resistor's value would determine with high accuracy the output frequency of the oscillator circuit. This input should be robust against capacitance to make the circuit easy to use.

Finally, it would be desirable to provide a monolithic integrated circuit which implements the oscillator circuit, reducing the circuit size and making it practical for use in a wide array of applications.

SUMMARY OF THE INVENTION

It is an object of the present invention to provide a variable frequency oscillator circuit utilizing a switched-capacitor feedback loop to minimize the inaccuracy of a typical oscillator.

It is also an object of the present invention to provide an input to the oscillator circuit whereby the user may couple a resistor to the oscillator circuit. The resistor's value would determine with high accuracy the output frequency of the oscillator circuit. This input should be robust against capacitance to make the circuit easy to use.

Finally, it is an object of the invention to provide a monolithic integrated circuit which implements the oscillator circuit, reducing the circuit size and making it practical for use in a wide array of applications.

An oscillator circuit which provides an oscillating output signal with an integrating amplifier circuit is provided. The amplifier circuit is coupled to the switched capacitor and also coupled to a user input which is adapted for coupling to a power supply through a frequency-setting resistor. The amplifier circuit provides an output waveform which can be converted to the oscillating output signal in a number of suitable of ways.

The frequency-setting resistor preferably sets the frequency of the output waveform and the oscillating signal.

The waveform and the oscillating signal preferably are proportional to one another. Switches are coupled to the switched capacitor that control the coupling of the switched capacitor to the amplifier circuit. The switches are controlled by the oscillating output signal.

The oscillator circuit includes a controllable current source—e.g., a precision current mirror—to preferably copy the input resistor current to an input of the amplifier circuit. The oscillator circuit also preferably includes a suitable VCO (Voltage Controlled Oscillator) that is adapted to provide the oscillating signal based on the output waveform. The VCO may be controlled by an output of a sample-hold circuit where the sample-hold circuit is coupled to receive the output waveform.

BRIEF DESCRIPTION OF THE DRAWINGS

The objects and advantages of the invention will be apparent upon consideration of the following detailed description, taken in conjunction with the accompanying drawings, in which like reference characters refer to like parts throughout.

DETAILED DESCRIPTION OF THE INVENTION

Figure 1:
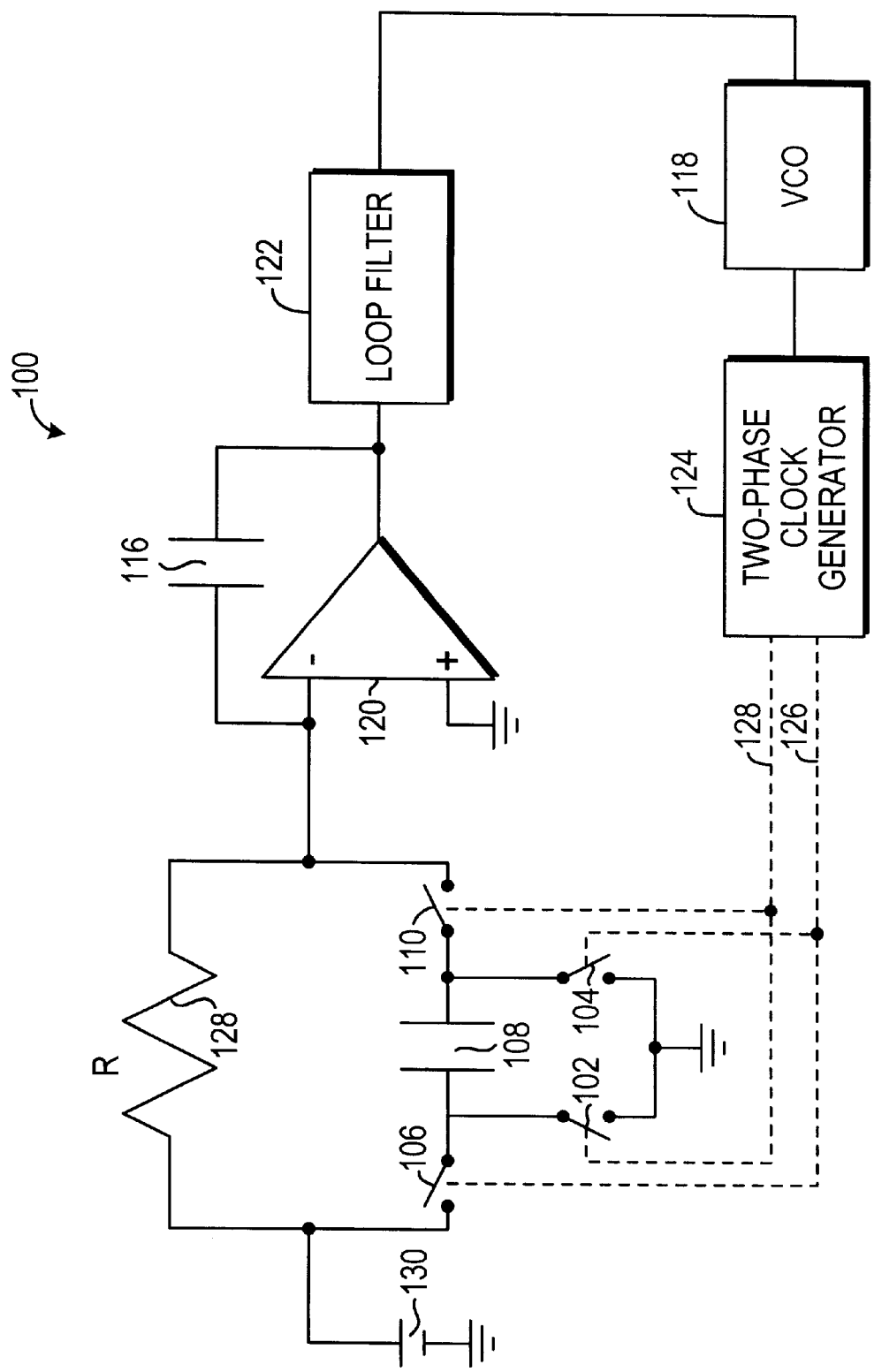
FIG. 1 is a diagram of a conventional switched capacitor frequency control loop.
Figure 2:
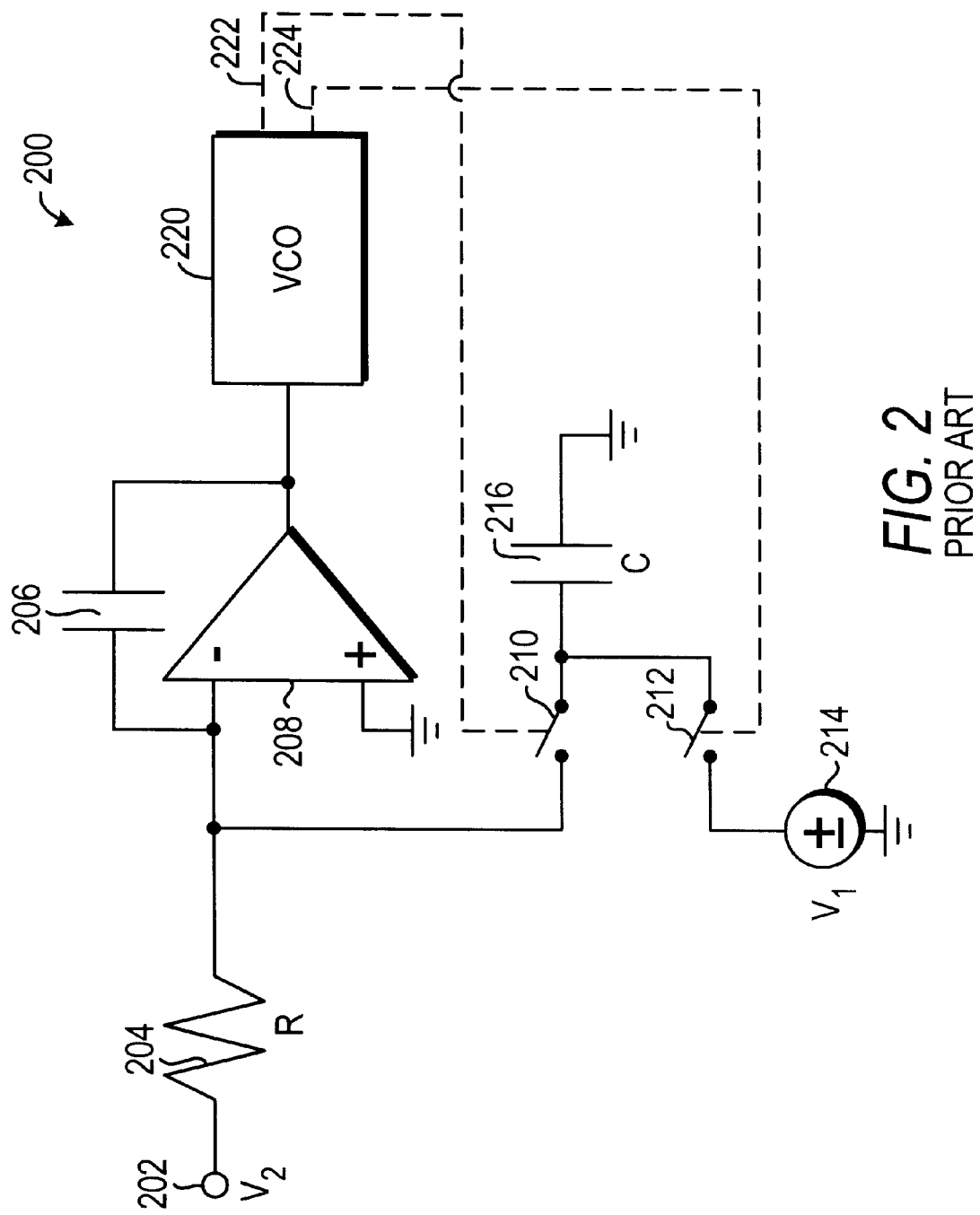
FIG. 2 is a diagram of another conventional switched capacitor frequency control loop.

A precision oscillator circuit in accordance with the principles of the present invention has an adjustable frequency. Frequency-adjustable oscillator circuits are useful to designers of electronic circuits because a precision oscillator circuit packaged as one component may be re-used in a multitude of electronic circuit designs requiring oscillators of varying frequencies. The precision oscillator can be programmed for a wide range of frequencies with accuracy and fine granularity in frequency.

The present invention uses a switched capacitor frequency control loop in conjunction with an op-amp circuit to provide a periodic sawtooth-like waveform. She op-amp circuit is preferably connected in an integrating amplifier circuit configuration. The op-amp circuit is preferably coupled to a constant current source. This configuration provides a ramped waveform at the output of the op-amp circuit.

The switched capacitor frequency control loop uses a switched capacitor to periodically pump charge or remove charge from the op-amp circuit such that it causes discrete jumps or drops in the voltage at the output of the op-amp circuit. The combination of the ramped waveform and discrete jumps or drops in voltage results in a sawtooth waveform at the output of the op-amp circuit.

The frequency of the sawtooth waveform may depend only on the value of the current source coupled to the op-amp circuit, the size of the switched capacitor and the change in voltage across the switched capacitor. A current source may be implemented by generating current flow through an external, and possibly, user-supplied resistor. The resistor, which may provide any resistive value across a given range, is effectively a frequency-setting resistor. The oscillator may provide a user input adapted to be coupled with the resistor.

The switched capacitor is detached from the frequency-setting resistor in the present invention. For example, the switched capacitor is coupled to one input of the op-amp circuit, while the frequency-setting resistor is coupled to another input of the op-amp circuit. The detachment prevents the discrete jumps in voltage effected by the switched capacitor from disturbing the current supply through the resistor.

The detachment of the frequency-setting resistor from the switched capacitor preferably necessitates the accurate copying of the current flow through the resistor to the current flow at the capacitor. The resistor current is preferably copied to an input of the op-amp circuit using a matched current mirror.

The difference between the resistor current and average switched-capacitor current provides an error signal used to adjust the oscillator frequency. The feedback loop seeks to equalize the current through the resistor and switched capacitor, forcing the error signal to substantially zero. Under such conditions, the output waveform will be at the desired frequency.

The sawtooth waveform may be filtered by a loop filter or a sample-hold circuit or any other suitable circuit to attenuate undesired harmonics in the waveform. The filtered signal may then be used to bias a variable oscillator to generate a constant frequency periodic waveform. The resultant waveform may be a 50% duty cycle square output waveform which is useful to designers of digital electronic circuits.

The output waveform is used to control the coupling and de-coupling of the switched capacitor to the input of the op-amp circuit. At least two switches, or sets of switches are used to control the coupling of the switched capacitor.

One switch, or set of switches, is closed during one half-cycle (A) of the output waveform, and couples the switched capacitor to the op-amp circuit. This switch, or set of switches, is open during the other half-cycle (B) of the output waveform, and de-couples the switched capacitor from the op-amp circuit. The other switch, or set of switches is closed during the half-cycle (B) of the output waveform, and couples the switched capacitor to a voltage reference. The voltage reference may be implemented at a zero volt level. This switch, or set of switches, is open during the other half-cycle (A) of the output waveform, and de-couples the switched capacitor from the voltage reference. This change of voltage differential across the switched capacitor causes a transfer of charge from the switched capacitor when the switched capacitor is coupled to the op-amp circuit.

The present invention provides a precision oscillator using an op-amp circuit. The effect of the offset voltage in op-amp circuits, which may reduce the accuracy of the attainable frequency of the oscillator circuit, is mitigated in one of two ways. One method is to keep the voltages at the inputs of the op-amp circuit substantially constant. The oscillation frequency is preferably proportional to the ratio of the voltage across the resistor and the voltage across the switched capacitor when it is coupled to the op-amp. By adapting the circuit to maintain a constant voltage at the op-amp inputs, any offset voltage creates a constant percentage error in the voltage ratio. This error may preferably be eliminated by a one-time trim of the circuit.

Coupling the frequency setting resistor to a low impedance input causes the current through the frequency setting resistor to change with different values of the resistor. The low impedance input also causes the voltage at the input with which the resistor is coupled to remain substantially constant. If the user provides a constant current to the external resistor instead of a constant voltage, the voltage across the external resistor, and the inputs of the op-amp, will vary with the resistor value. In this case, the offset error voltage in the op-amp creates a percentage frequency error that varies with the resistor. This error may be corrected by a linearity correction circuit, which is also useful in a constant input voltage implementation, because it also corrects for op-amp error due to limited-gain bandwidth.

The ramping of the output waveform of the op-amp circuit continues after the switched capacitor has transferred charge to the op-amp circuit. The ramping results in additional voltage seen across the input of the op-amp circuit due to the limited gain of the op-amp circuit while the switched capacitor is still coupled to the op-amp circuit. This additional voltage changes the voltage differential across the switched capacitor and hence, the total charge transferred by the switched capacitor. This additional voltage affects the frequency of the output signal of the amplifier circuit.

The additional erroneous voltage introduced by the limited gain of the op-amp circuit may be corrected by the coupling of a linearity correction circuit comprising a second switched capacitor and a voltage based on the current through the frequency-setting resistor to the input of the op-amp circuit which is coupled to the first switched capacitor. If the user input is constant current (high-impedance), this circuit will also correct error due to the op-amp's offset voltage.

Every half cycle (A) that the switched capacitor is coupled to the input of the op-amp circuit, an additional switch or set of switches may couple the second switched capacitor to the op-amp circuit. The second switched capacitor transfers an amount of charge proportional to the charge introduced by the limited gain-bandwidth product of the op-amp circuit and/or offset voltage of the op-amp circuit. Every other half cycle (B), the second switched capacitor is decoupled from the op-amp circuit and coupled to a bias voltage.

A bias voltage which is preferably generated by copying or mirroring the external resistor current through a second resistor, is switched onto the second switched capacitor. The generation of the bias voltage controls the amount of charge transferred by the second switched capacitor each clock cycle. The proper generation of the bias voltage will result in the subtraction of a substantially constant amount of time from the oscillation period, regardless of the actual period or frequency value. This creates a non-linear adjustment to the frequency which preferably corrects for the error introduced by the limitations of the op-amp circuit.

Figure 3:
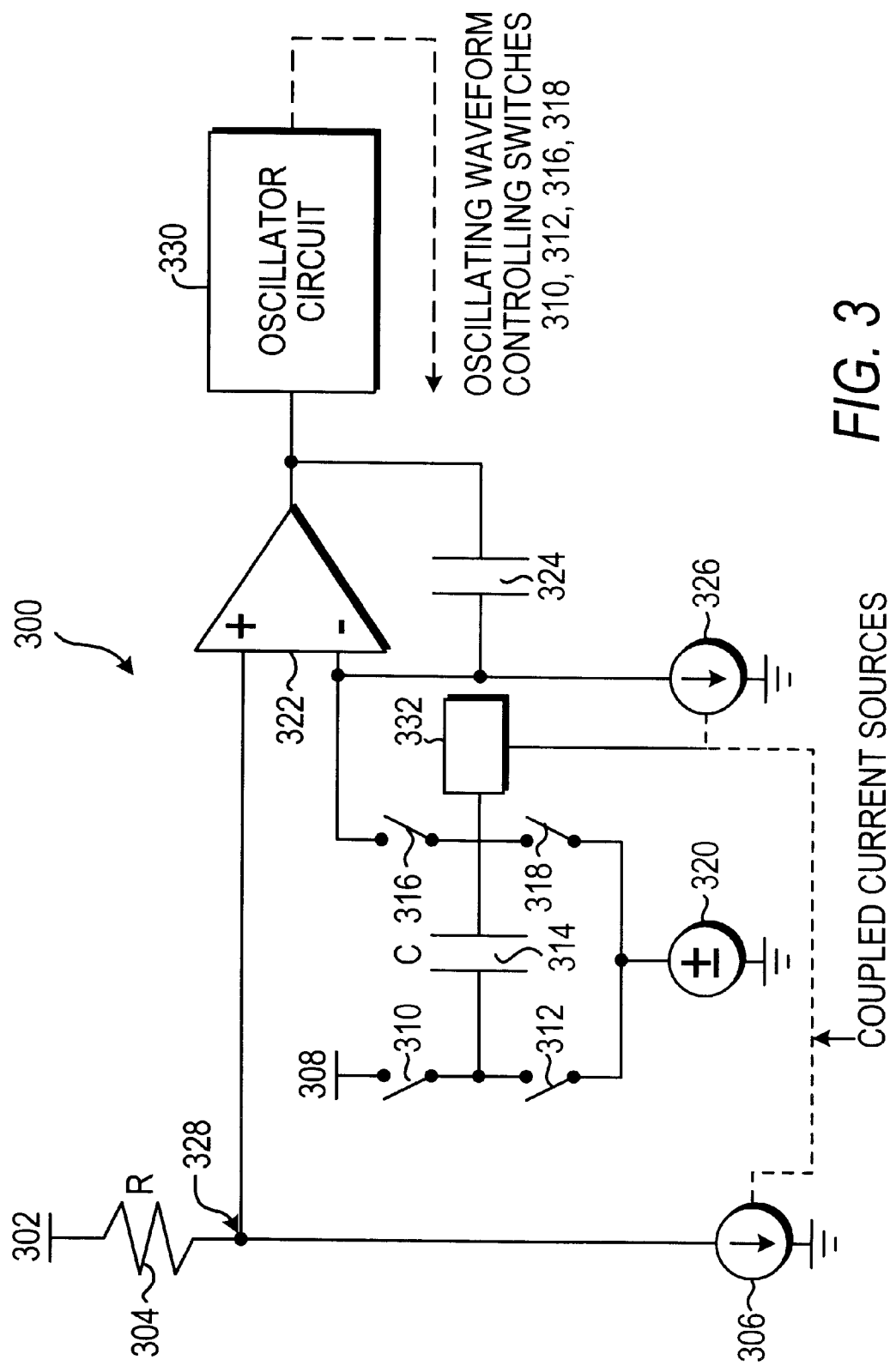
FIG. 3 is a diagram of an embodiment of an oscillator circuit according to the invention.

An embodiment of the present invention, an oscillator circuit 300, is shown in FIG. 3. One feature of the present invention is the provision of an input pin 328 adapted for coupling to a frequency-setting resistor 304 (R) which is preferably detached from a switched capacitor 314 (C). The value of resistor 304, which is coupled between power supply 302 and node 328, controls the voltage at node 328, which is copied by op-amp 322 to the switched-capacitor.

Prior art circuits indicate both frequency-setting resistor and switched capacitor coupled to an input of an integrated amplifier circuit. The present invention preferably separates frequency-setting resistor 304 from switched capacitor 314, hence separating user input 328 from switched capacitor 314. The detachment of user input 328 from switched capacitor 314 prevents a sudden voltage change occurring at user input 328 when switched capacitor 314 is coupled with amplifier circuit 322. This ensures that the voltage across resistor 304 is not disturbed.

The output of the integrating amplifier drives variable oscillator 330. This oscillator generates the user output and the clock waveforms that control the coupling of the switched capacitor. Oscillator circuit 300 also includes the use of current sources 326 and 306. These current sources are substantially coupled to each other, to provide currents that are proportional to each other. In this embodiment, frequency error due to random op-amp offset voltage and limited gain-bandwidth may be suppressed by linearity correction circuit 332. The operation of linearity correction circuit 332 is explained below, with respect to element 438 of FIG. 4. Linearity correction circuit 332 may be substantially coupled to current sources 326 and 306.

The steady-state frequency f, of oscillator circuit 300 is described by the equation $f=1/(R*C)$, where R is resistor 304 and C is capacitor 314. Oscillator circuit 300 also shows the use of current sources 326 and 306, which are substantially coupled to each other, to set the currents at inverting and non-inverting inputs of amplifier circuit 322.

Figure 4:
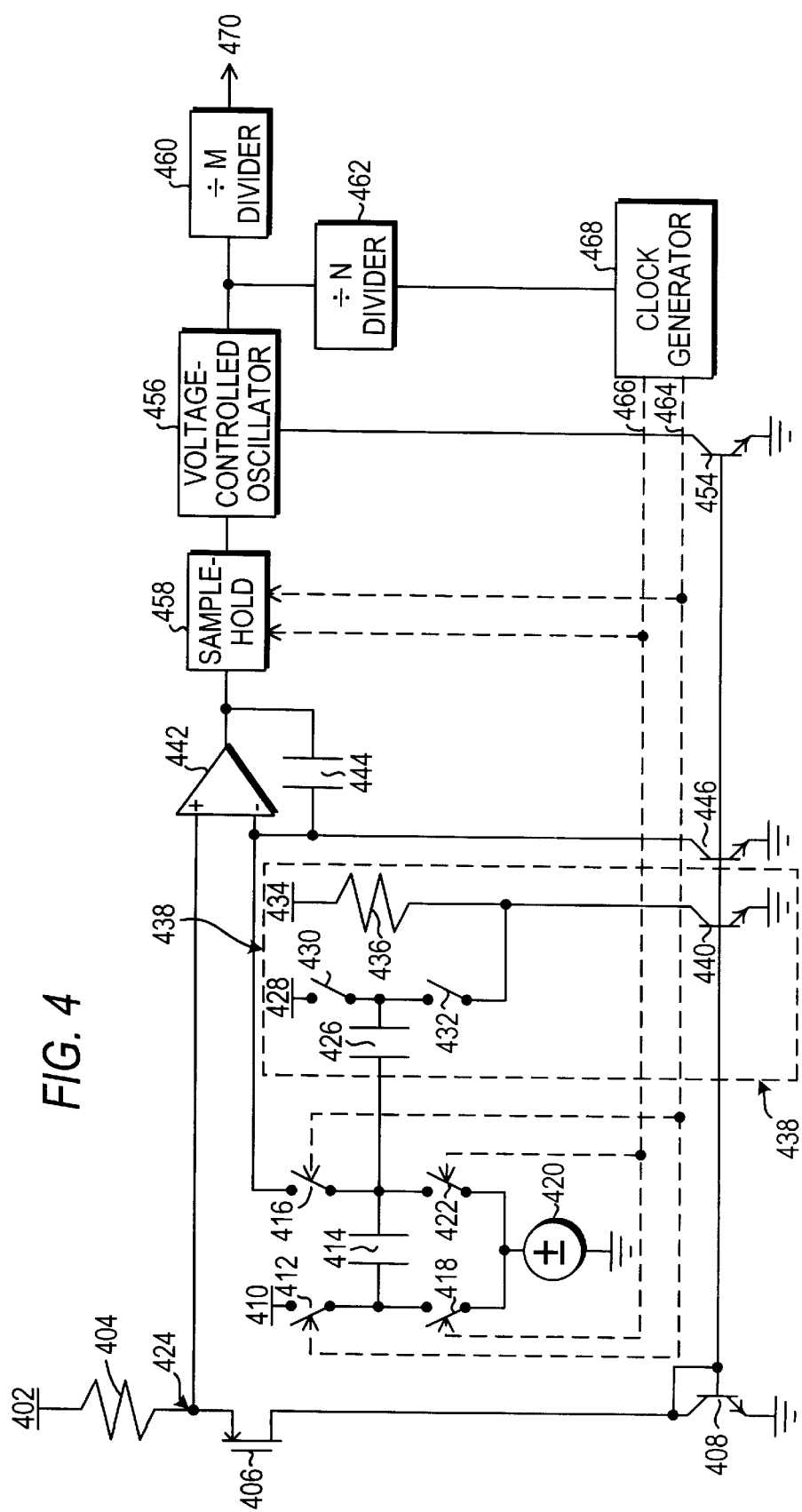
FIG. 4 is a diagram of an embodiment of an oscillator circuit according to the invention.

Another embodiment of the present invention is shown in FIG. 4. An oscillator circuit 400 contains an input 424 adapted to couple with a preferably user-provided resistor 404. Resistor 404 is preferably coupled between a non-inverting input of an integrating amplifier circuit 442 and a power supply 402.

When switches 412 and 416 are closed and switches 418 and 422 are opened, a switched capacitor 414 is coupled to the inverting input of amplifier circuit 442. The additional current flow through switched capacitor 414 changes the voltage level at the output of amplifier circuit 442. The output of amplifier circuit 442 exhibits a substantially instantaneous decrease in its voltage level. This is due to the diversion of the charge from switched capacitor 414.

Amplifier circuit 442 is preferably coupled to a capacitor 444 in an integrating amplifier configuration. When switches 412 and 416 are open and switches 418 and 422 are closed, most of the current sunk by transistor 446 flows from a capacitor 444. The current flow causes a positive-going ramp in the voltage level at the output of amplifier circuit 442. The slope of the positive-going ramp is substantially inversely proportional to the value of capacitor 444.

The operation of switches 412, 416, 418 and 422 is as follows. Switches 412 and 416 are closed and opened together, while switches 418 and 422 are closed and opened together. Switches 412 and 416 are controlled by a clock signal 464 from clock generator 468; switches 412 and 416 stay closed when clock signal 464 is high and open when clock signal 464 is low. A clock signal 466 which is 180° phase-shifted from clock signal 464 is used to control switches 418 and 422. Switches 418 and 422 are closed when clock signal 466 is high and open when clock signal 466 is low.

As the voltage difference between the terminals of switched capacitor 414 is fixed for the remainder of the duration that switches 412 and 416 are closed, no more charge is transferred by switched capacitor 414. Therefore, the output of the amplifier circuit 442 continues with a positive-going ramp in its voltage level.

The amplitude of the instantaneous decrease in the voltage level of the output of amplifier circuit 442 is substantially proportional to the change in voltage across the terminals of switched capacitor 414. The change in voltage is preferably implemented such that it is substantially proportional to the voltage difference across frequency-setting resistor 404. The change in the voltage across the terminals of switched capacitor 414 determines the amount of charge transferred from switched capacitor 414. In addition, amplifier circuit 442 preferably matches the switched-capacitor voltage to the resistor voltage.

The non-inverting input of amplifier circuit 442 is preferably coupled to a diode-connected transistor 408. Diode-connected transistor 408 provides a sink for the current which flows through resistor 404. Transistor 406 couples the input resistor to transistor 408, while maintaining the voltage at input 424 (the non-inverting input of amplifier circuit 442) at a substantially constant value. The voltage at input 424 is determined by the gate voltage of transistor 406, which is biased to maintain the desired reference voltage across resistor 404.

Diode-connected transistor 408 is preferably coupled to current mirror transistors 446, 440 and 454. Current mirror transistors that match transistor 408 may be implemented to provide current sources that are substantially identical in value to each other.

A first current mirror 446 is preferably coupled to the inverting input of amplifier circuit 442, thus copying the current through resistor 404 to the inverting input of amplifier circuit 442.

The use of current mirror transistor 446 enables the detachment of user input 424 and hence, the detachment of frequency-setting resistor 404 from the inverting input of amplifier circuit 442. Thus, current mirror transistor 446 also enables the separation of frequency-setting resistor 404 from switched capacitor 414.

A non-zero voltage difference may be developed between non-inverting and inverting inputs of amplifier circuit 442. This is because amplifier circuit 442 is non-ideal and has non-infinite gain. The voltage difference developed changes the amount of charge transferred by switched capacitor 414 every clock cycle, adding error to the oscillating signal at the output of amplifier circuit 442.

A linearity correction circuit 438, similar to linearity correction circuit 332 in FIG. 3, corrects for the error voltage by using switches 430 and 432 to couple a switched capacitor 426 and a bias voltage to compensate for the non-zero voltage difference. Switch 430 is closed and switch 432 is open when switches 418 and 422 are closed, thereby isolating switched capacitor 426 from the bias voltage. When charge is to be transferred by switched capacitor 414, switch 430 is open and switch 432 is closed. This causes a removal of charge by switched capacitor 426 which corrects for the error introduced by the finite gain of amplifier circuit 442.

A second current mirror transistor 440 is preferably coupled to linearity correction circuit 438 to copy the current from the frequency-setting resistor to resistor 436. This creates a bias voltage for switched-capacitor 426 that is proportional to the input current, or inversely proportional to resistor 404. In addition, using current mirror transistor 440 ensures that the choice of values for resistor 436 and switched capacitor 426 is dependent on the limited gain of amplifier circuit 442.

The output of amplifier circuit 442 substantially controls a voltage-controlled oscillator (VCO) 456. VCO 456 may provide the user with a waveform output with specific characteristics, for example, a 50% duty cycle square wave. The voltage of an input waveform to VCO 456 substantially determines the frequency of the waveform output of VCO 456.

The output of amplifier circuit 442 contains various component frequencies which may not be desired in the output from VCO 456. Therefore, a sample-hold circuit 458 is preferably coupled with amplifier circuit 442 to attenuate component frequencies of the sawtooth waveform from amplifier circuit 442. Sample-hold circuit 458 may sample the output from amplifier circuit 442 at the same frequencies of sample-hold clocks 464 and 466. The switched-capacitor introduces undesired components at this frequency. By sampling at the same frequency, the effects of those undesired components are filtered out.

A third current mirror transistor 454 is used to bias the VCO so that its center frequency is near the desired frequency. The voltage input may then finely adjust the frequency to the desired value, with a low voltage-to-frequency gain. A low VCO gain reduces jitter by reducing the noise gain of the circuit. In addition, since the current mirror bias is outside of the feedback loop, the circuit will react quickly to changes in the input resistor.

A clock divider 460 provides flexibility to the user by increasing the range of frequencies provided by oscillator circuit 400. A user output 470 is preferably provided to access the square waveform output from VCO 456.

A clock divider 462 drops the frequency of the clock signals from clock generator 468 that are used to control switching capacitors 414 and 426 in oscillator circuit 400. This reduces overall power consumption and improves the accuracy of oscillator circuit 400.

Thus, it is seen that a precision oscillator with a frequency-setting resistor utilizing a switched capacitor frequency control loop is provided according to the principles of the present invention. Persons skilled in the art will appreciate that the present invention can be practiced by other than the described embodiments, which are presented for purposes of illustration rather than of limitation, and the present invention is limited only by the claims which follow.

What is claimed is:

1. A method for generating a high-precision periodic oscillating waveform using an integrating amplifier circuit, the amplifier circuit having a first input adapted to be coupled with a frequency-setting resistor, the method comprising:

generating a current through the frequency-setting resistor;

coupling the voltage across the frequency-setting resistor to a first input of the integrating amplifier circuit;

copying the current to a second input of the integrating amplifier circuit using a controllable current source;

generating a ramped output waveform with the integrating amplifier circuit based on the current at the second input of the integrating amplifier circuit;

generating discrete changes in the ramped output waveform using a first switched capacitor coupled to the second input of the integrating amplifier circuit, to provide the oscillating waveform with a frequency based on the values of the first switched capacitor and the frequency-setting resistor, the oscillating waveform having a substantially constant average value at a particular frequency; and controlling the coupling of the switched capacitor with the integrating amplifier circuit using switches substantially controlled by the oscillating waveform.

2. The method of claim 1 further comprising smoothing the output of the integrating amplifier circuit using a sample-hold circuit.

3. The method of claim 1 further comprising controlling a voltage controlled oscillator to provide the oscillating waveform based on the output waveform.

4. The method of claim 3 further comprising copying the current from the frequency-setting resistor to control the operation of the voltage controlled oscillator.

5. The method of claim 3 further comprising dividing a frequency of the oscillating waveform from the voltage controlled oscillator to provide a divided output waveform, wherein the divided output waveform is used to control the operation of the switched capacitor circuits.

6. The method of claim 1 further comprising correcting frequency error by using a second switched capacitor to transfer charge at the second input of the integrating amplifier.

7. The method of claim 6 further comprising supplying terminals of the second switched capacitor with a voltage based on the current through the frequency-setting resistor, in order to correct a frequency error in the oscillating waveform.

8. The method of claim 1 further comprising maintaining substantially constant voltages at the inputs of the integrating amplifier circuit.

9. An oscillator circuit comprising an integrating amplifier circuit, the amplifier circuit that provides an output waveform, the oscillator circuit comprising:

a first input of the amplifier circuit being adapted for coupling to a power supply through a frequency-setting resistor;

a first switched capacitor coupled to a second input of the amplifier circuit;

a plurality of switches that is coupled to the first switched capacitor that controls the coupling of the first switched capacitor to the integrating amplifier circuit, and wherein the plurality of switches is substantially controlled by the output waveform; and a first controllable current source coupled to the frequency-setting resistor and to the switched capacitor circuit, wherein the current source provides a current to the second input that is proportional to the current through the frequency-setting resistor.

10. The oscillator circuit of claim 9 further comprising a sample-hold circuit coupled to the output of the integrating amplifier circuit.

11. The oscillator circuit of claim 9 further comprising a voltage controlled oscillator adapted to convert the output waveform into an oscillating output signal.

12. The oscillator circuit of claim 11 further comprising a clock divider circuit coupled to the output of the voltage controlled oscillator, wherein the clock divider circuit is coupled to the plurality of switches.

13. The oscillator circuit of claim 9 further comprising a linearity correction circuit coupled to the second input of the integrating amplifier which corrects for a frequency error in the output waveform.

14. The oscillator circuit of claim 13 wherein the linearity correction circuit further comprising a second switched capacitor coupled to the first switched capacitor and to a voltage based on the current through the frequency-setting resistor.

15. The oscillator circuit of claim 9, wherein the first controllable current source comprises a bipolar transistor-based current mirror.

16. The oscillator circuit of claim 9 wherein the current through the switched capacitor circuit is in a one-to-five ratio with the current through the frequency-setting resistor.

17. The oscillator circuit of claim 9 further comprising a voltage controlled oscillator coupled to the output of the integrating amplifier wherein the current from the frequency-setting resistor is copied to the voltage-controlled oscillator in order to set a gain of the voltage controlled oscillator.

18. A method for generating a high-precision periodic oscillating waveform using an integrating amplifier circuit, the amplifier circuit having a first input adapted to be coupled with a frequency-setting resistor, the method comprising:

generating a current through the frequency-setting resistor;

coupling the voltage across the frequency-setting resistor to a first input of the integrating amplifier circuit;

generating a second current to a second input of the integrating amplifier circuit using a controllable current source, the second current being proportional to the first current;

generating a ramped output waveform with the integrating amplifier circuit based on the current at the second input of the integrating amplifier circuit;

generating discrete changes in the ramped output waveform using a first switched capacitor coupled to the second input of the integrating amplifier circuit, to provide the oscillating waveform with a frequency based on the values of the first switched capacitor and the frequency-setting resistor, the oscillating waveform having a substantially constant average value at a particular frequency;

controlling the coupling of the switched capacitor with the integrating amplifier circuit using switches substantially controlled by the oscillating waveform;

converting the output waveform using a sample-hold circuit to provide a sampled and held output; and controlling a voltage controlled oscillator to provide the oscillating waveform based on sampled and held output.

* * * * *

UNITED STATES PATENT AND TRADEMARK OFFICE
CERTIFICATE OF CORRECTION

PATENT NO. : 6,342,817 B1
DATED : January 29, 2002
INVENTOR(S) : Andrew H. Crofts et al.

It is certified that error appears in the above-identified patent and that said Letters Patent is hereby corrected as shown below:

Drawings,
Replace the figure on the title page with the following:

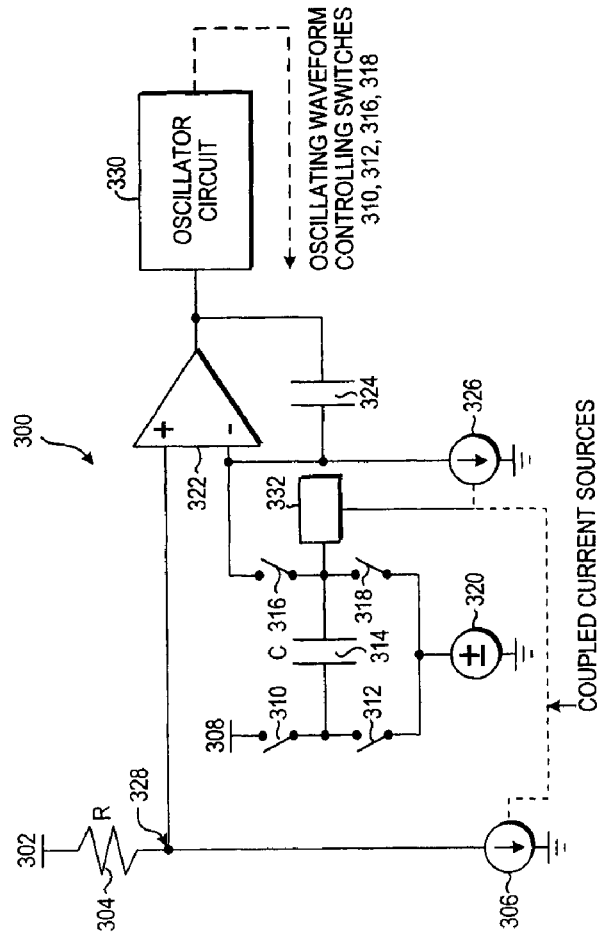

UNITED STATES PATENT AND TRADEMARK OFFICE
CERTIFICATE OF CORRECTION

PATENT NO. : 6,342,817 B1  Page 2 of 5
DATED : January 29, 2002
INVENTOR(S) : Andrew H. Crofts et al.

It is certified that error appears in the above-identified patent and that said Letters Patent is hereby corrected as shown below:

Drawings cont'd,
Replace drawing sheet 1 with the following:

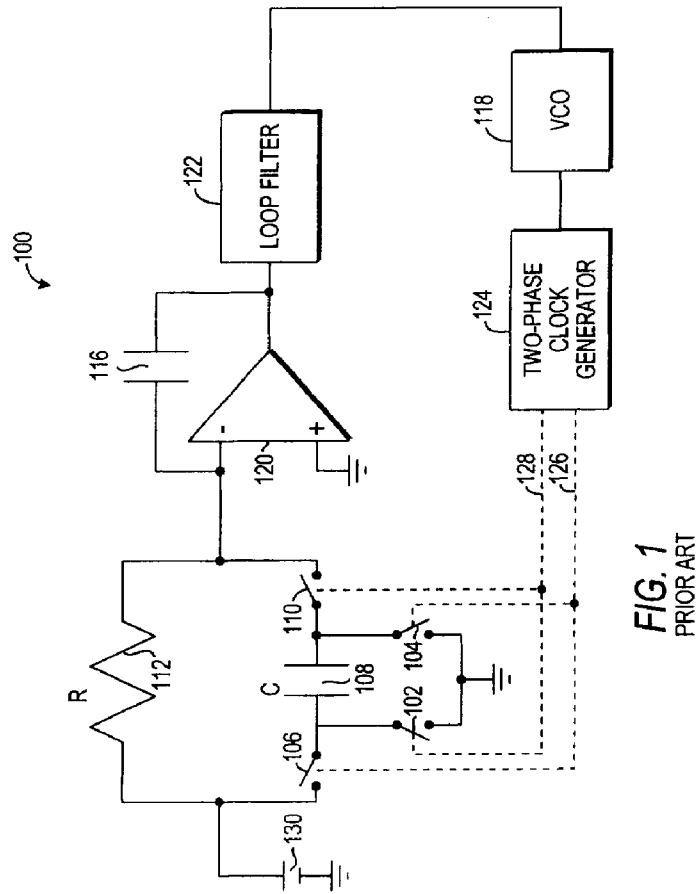

FIG. 1
PRIOR ART

UNITED STATES PATENT AND TRADEMARK OFFICE
CERTIFICATE OF CORRECTION

PATENT NO.    : 6,342,817 B1
DATED         : January 29, 2002
INVENTOR(S)   : Andrew H. Crofts et al.

It is certified that error appears in the above-identified patent and that said Letters Patent is hereby corrected as shown below:

Drawings cont'd,
Replace drawing sheet 3 with the following:

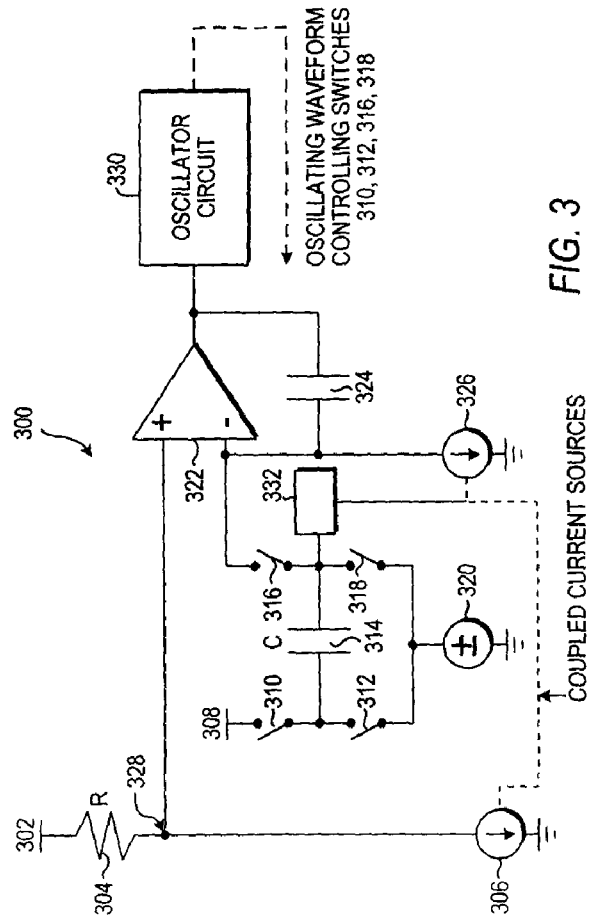

FIG. 3

UNITED STATES PATENT AND TRADEMARK OFFICE
CERTIFICATE OF CORRECTION

PATENT NO.    : 6,342,817 B1
DATED         : January 29, 2002
INVENTOR(S)   : Andrew H. Crofts et al.

It is certified that error appears in the above-identified patent and that said Letters Patent is hereby corrected as shown below:

<u>Drawings cont'd,</u>
Replace drawing sheet 4 with the following:

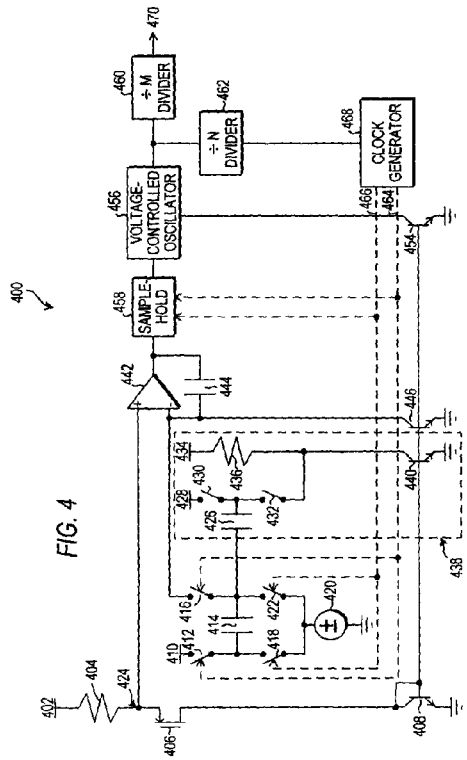

FIG. 4

UNITED STATES PATENT AND TRADEMARK OFFICE
CERTIFICATE OF CORRECTION

PATENT NO.   : 6,342,817 B1
DATED        : January 29, 2002
INVENTOR(S)  : Andrew H. Crofts et al.

It is certified that error appears in the above-identified patent and that said Letters Patent is hereby corrected as shown below:

Column 2,
Line 43, change "switches" to -- clock signals --.

Column 5,
Line 45, change "She" to -- The --.

Signed and Sealed this

Fourth Day of February, 2003

JAMES E. ROGAN
*Director of the United States Patent and Trademark Office*